(12) United States Patent
Engel et al.

(10) Patent No.: US 9,848,493 B1
(45) Date of Patent: Dec. 19, 2017

(54) PRINTED CIRCUIT BOARD HAVING IMPROVED HIGH SPEED TRANSMISSION LINES

(71) Applicant: FOXCONN INTERCONNECT TECHNOLOGY LIMITED, Grand Cayman (KY)

(72) Inventors: Andrew Engel, Portola Valley, CA (US); Paul Yu, Sunnyvale, CA (US); Klaus Giessler, Meulo Park, CA (US); Omid Momtahan, Palo Alto, CA (US); Michael John Brosnan, Fremont, CA (US); David Meadowcroft, San Sose, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/373,917

(22) Filed: Dec. 9, 2016

(51) Int. Cl.
| | |
|---|---|
| *H05K 1/14* | (2006.01) |
| *H05K 1/18* | (2006.01) |
| *H05K 3/32* | (2006.01) |
| *H05K 1/02* | (2006.01) |
| *H01R 12/72* | (2011.01) |

(52) U.S. Cl.
CPC ............. *H05K 1/18* (2013.01); *H01R 12/721* (2013.01); *H05K 1/0242* (2013.01); *H05K 3/328* (2013.01)

(58) Field of Classification Search
CPC .......... H05K 1/00; H05K 1/125; H05K 1/227; H05K 1/245; H05K 1/248; H01R 12/00; H01R 12/53; H01R 12/57; H01R 12/62; H01R 13/00; H01R 13/40; H01R 13/64; H01R 13/646
USPC ................ 174/261, 250, 268; 361/737, 758; 439/60, 76.1, 607.01
See application file for complete search history.

(56) References Cited

U.S. PATENT DOCUMENTS

| | | | | |
|---|---|---|---|---|
| 5,563,770 | A * | 10/1996 | Bethurum | G06K 19/077 257/679 |
| 6,203,328 | B1 * | 3/2001 | Ortega | H01R 12/721 439/60 |
| 6,241,534 | B1 * | 6/2001 | Neer | H01R 31/06 439/76.1 |
| 9,466,929 | B2 | 10/2016 | Wu et al. | |
| 2012/0282807 | A1 * | 11/2012 | Regnier | H01R 13/6469 439/607.01 |
| 2013/0264107 | A1 * | 10/2013 | Meyers | H01R 12/53 174/268 |

* cited by examiner

*Primary Examiner* — Xiaoliang Chen
(74) *Attorney, Agent, or Firm* — Wei Te Chung; Ming Chieh Chang

(57) ABSTRACT

A printed circuit board assembly comprises a printed circuit board (PCB) defining a mounting end and an opposite contacting end, a row of first pads on the mounting end, a row of second pads on the contacting end, and an edge connector on the contacting end electrically contacted with the second pads, and a high speed line module mounted on a top side of the PCB and including a group of conductive lines, the conductive lines extending parallel to each other over the plane of the PCB, each conductive line having two ends electrically connected to corresponding first and second pads, respectively.

15 Claims, 6 Drawing Sheets

US 9,848,493 B1

PRINTED CIRCUIT BOARD HAVING IMPROVED HIGH SPEED TRANSMISSION LINES

BACKGROUND ASSEMBLY OF THE INVENTION

1. Field of the Invention

The present invention relates to a printed circuit board (PCB) assembly having improved high speed transmission lines, and more particularly to a printed circuit board assembly having improved signal integrity.

2. Description of Related Arts

In current PCB design of a fiber optics module, high speed lines stretch from the front of the PCB where the optics are to the back of the module and an edge connector is to the front, which may be a length of greater than 30 mm. Along this length high speed traces are surrounded on three sides by dielectrics, which hurts signal integrity. In addition, components and/or other traces must be routed around and away from these lines, increasing board complexity.

In transceiver module designs, as data rates increase, the need to improve signal integrity grows. This often results in expensive PCB assemblies as more expensive materials are used for the dielectric to insulate the traces/signals from one another. This is especially true for the high speed signals. In order to reduce cost, it would be preferable to use the least expensive dielectric material possible.

U.S. Patent Application Publication No. 20130264107, issued to Meyers on Oct. 10, 2013, discloses a circuit board including a substrate extending from a mounting end to an opposite end. The substrate includes one or more electrical traces that electrically connect signal mounting pads to corresponding mating pads. The electrical traces define electrical paths that extend along the substrate from the signal mounting pads to the corresponding mating pads. The electrical traces extend on the upper side of the substrate. But, in addition or alternatively, one or more of the electrical traces may be an internal trace that extends within the thickness T of the substrate between the upper side and the lower sides.

U.S. Pat. No. 9,466,929, issued to Wu et al. on Oct. 11, 2016, discloses a plug connector comprising a housing, a PCB received in the housing, and a plurality of terminals electrically connected with the PCB. The PCB comprises opposite upper and lower surfaces and respective rows of front and rear conductive pads on the upper and lower surfaces. The terminals are soldered between the front and rear conductive pads over the PCB.

SUMMARY OF THE INVENTION

An object of the present invention is to provide an improved signal integrity printed circuit board.

To achieve the above-mentioned object, a printed circuit board assembly is provided. The printed circuit board assembly comprises a printed circuit board (PCB) defining a mounting end and an opposite contacting end, a row of first pads on the mounting end, a row of second pads on the contacting end, and an edge connector on the contacting end electrically contacted with the second pads, and a high speed line module mounted on a top side of the PCB and including a group of conductive lines, the conductive lines extending parallel to each other over the plane of the PCB, each conductive line having two ends electrically connected to corresponding first and second pads, respectively.

According to the present invention, the printed circuit board assembly uses high speed differential transmission lines which is individual wires and could improve the signal integrity.

DETAILED DESCRIPTION OF THE PREFERRED EMBODIMENT

Reference will now be made in detail to a preferred embodiment of the present invention.

Figure 1:
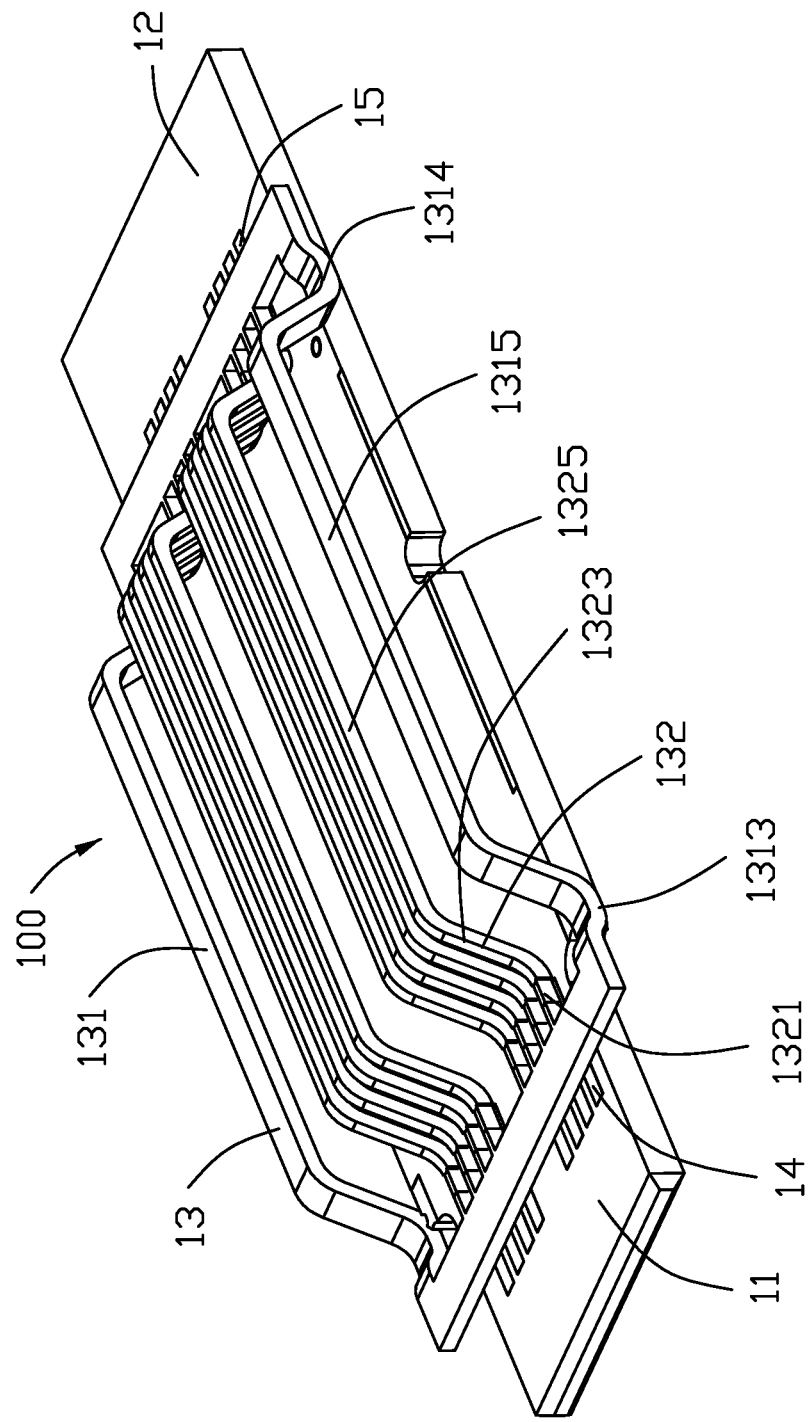
FIG. 1 is a perspective view of a first embodiment of a printed circuit board assembly in accordance with present invention.
Figure 2:
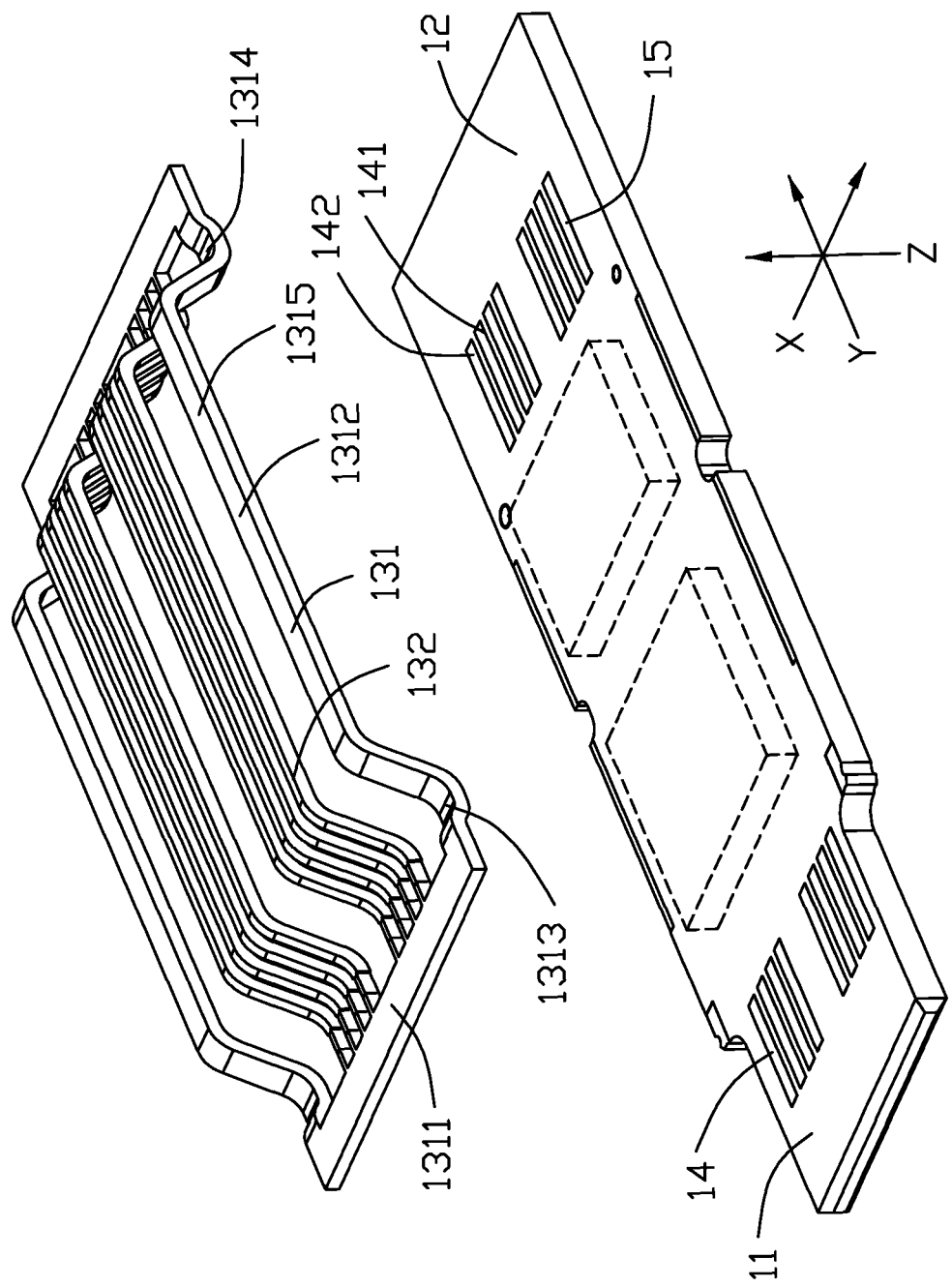
FIG. 2 is a partly exploded view of printed circuit board assembly as shown in FIG. 1.
Figure 3:
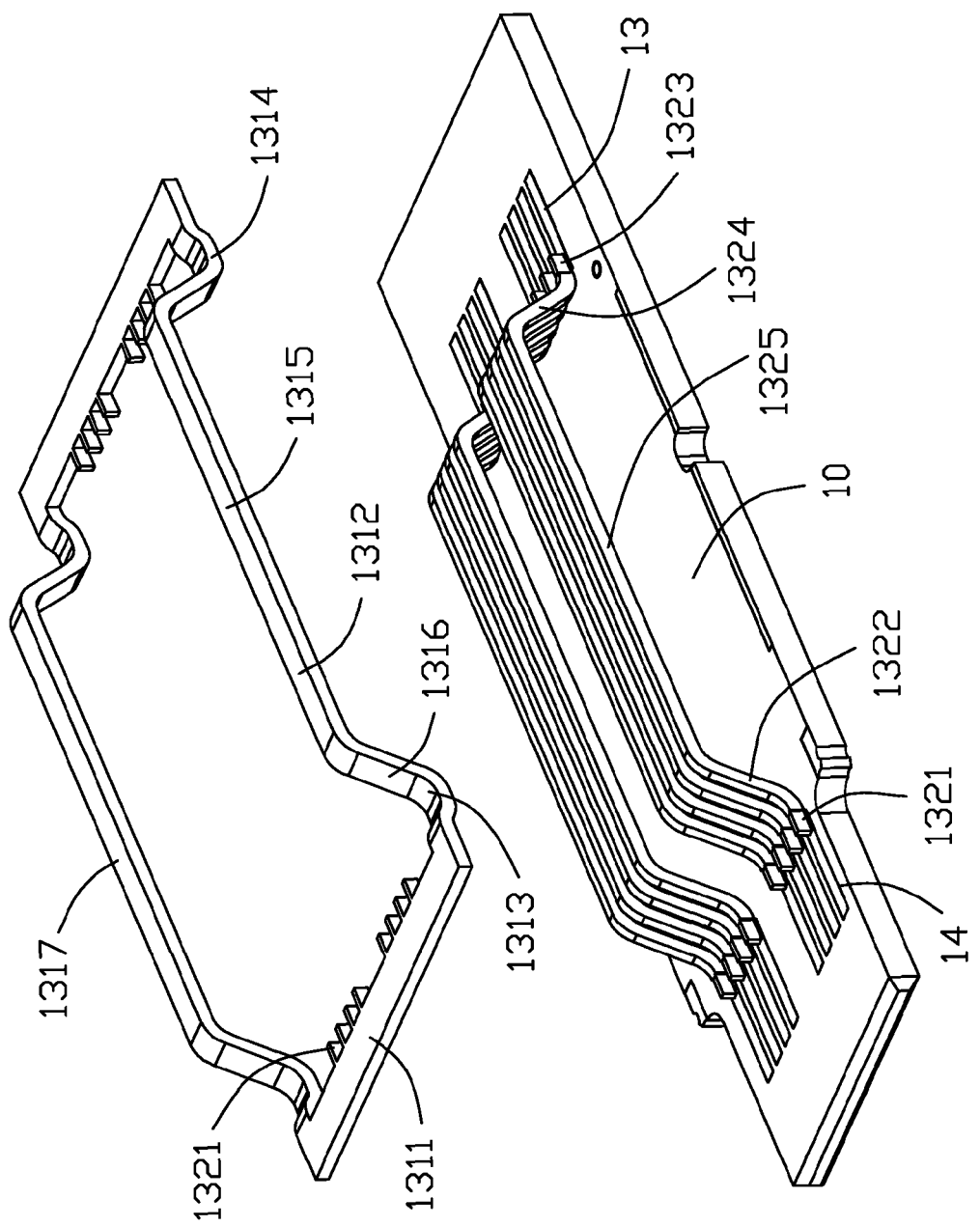
FIG. 3 is another partly exploded view of the printed circuit board assembly as shown in FIG. 2.

Referring to FIGS. 1 to 3, a first embodiment according to the present invention of the printed circuit board assembly 100 includes a printed circuit board 10 defining a mounting end 11 and an opposite contacting end 12, and a high speed line module 13 soldered on a top side of the printed circuit board 10. The mounting end 11 has a plurality of optics (not shown) located thereon. The contacting end 12 defines an edge connector (not shown) which has a plurality of conducting pads for electrically contacting with a mating connector (not shown).

The printed circuit board 10 defines a row of first pads 14 on the mounting end 11 electrically connected with the optics and a row of second pads 15 on the contacting end 12 electrically connected with the corresponding contacting pads of the edge connector. The contacting pads electrically connected with the second pads 15 are used for transmission of high-speed signals. The first pads 14 and the second pads 15 are one-to-one correspondence in a horizontal direction. In the present embodiment, the number of a group of first pads 14 is four, and the second pads 15 are also the same. Both of the first pads 14 and the second pads 15 are provide with two same groups of pads, and each group includes a pair of differential signal pads 141 and a pair of grounding pads 142. The pair of differential signal pads 141 is disposed between the two grounding pads 142.

The high speed line module 13 includes a lead frame or carrier 131 of a rectangular ring and two groups of conductive lines 132 connected between the two opposite sides of the lead frame 131. Each group of conductive lines 132 includes four striped conductive lines 132 respectively extending in four vertical planes, which are spaced and parallel to each other. Understandably, to comply with the group of pads composed of the pair of signal pads 141 and the pair of grounding pads 142, the four conductive lines 132 include a pair of (outer) grounding lines and a pair of (inner) signal lines.

The lead frame 131 is formed along with the conductive lines 132 and is be used to both hold the conductive lines 132 relative to one another and orient them relative to the printed circuit board 10 for ease of assembly. The lead frame 131 includes two opposite first end sides 1311 extending along a horizontal direction and two opposite second sides 1312 extending along a front-to-back direction. Each of the second side 1312 defines a curved first holding portion 1313 rearwardly and downwardly extending from one first end side 1311, a curved second holding portion 1314 forwardly and downwardly extending from another first end side 1311 and an arched portion 1315 upwardly extended and connected between the first and second holding portion 1313, 1314. In the present embodiment, the arched portion 1315 defines two extension portions 1316 obliquely and upwardly extending from an end of the first and second holding portion 1313, 1314 respectively and symmetrical with each other, and a top portion 1317 connecting between the top ends of the extension portions 1316. The length of the first end side 1311 is greater than the width of the printed circuit board 10. The first holding portions 1313 of the two second sides 1312 hold the opposite sides of a front end of the printed circuit board 10, and the second holding portions 1314 of the two second sides 1312 hold the opposite sides of a rear end of the printed circuit board 10, to fix the printed circuit board 10 therebetween, hence, the top portion 1317 of the arched portion 1315 extends in a plane higher than the plane of the printed circuit board 10. In other embodiment, the arched portion 1315 may be of other shapes includes a portion extending in a plane higher than the plane of the printed circuit board 10.

Each of the conductive lines 132 defines a first connecting portion 1321 rearwardly extending from one first end side 1311, a first transition portion 1322 obliquely and upwardly extending from a rear end of the first connecting portion 1321, a second connecting portion 1323 forwardly extending from another first end side 1311, a second transition portion 1324 obliquely and upwardly extending from a front end of the second connecting portion 1323 and symmetrical with the first transition portion 1322, and a middle connecting portion 1325 connecting between the top ends of the first and second transition portions 1322, 1324. The middle connecting portion 1325 extends in a horizontal plane higher than the plane of the printed circuit board 10.

When assembling of the printed circuit board assembly 100 according to the first embodiment, The first and second holding portions 1313, 1314 of the lead frame 131 of the high speed line module 13 are interference fixed to both sides of the printed circuit board 10, while aligning and contacting the first and second connecting portions 1321, 1323 of the conductive lines 132 to the corresponding first and second pads 14, 15, to electrically connect the first pads 14 with the corresponding second pads 15 via the conductive lines 132, and then the first and second connecting portions 1321, 1323 are soldered on the corresponding first and second pads 14, 15, finally the first and second connecting portions 1321, 1323 are cut off to remove the lead frame 131 from the printed circuit board 10. The first and the second connecting portions 1321, 1323 may be previously formed with a broken mark, for facilitating the breaking operation thereof, thereby facilitating removing of the lead frame 131.

Figure 4:
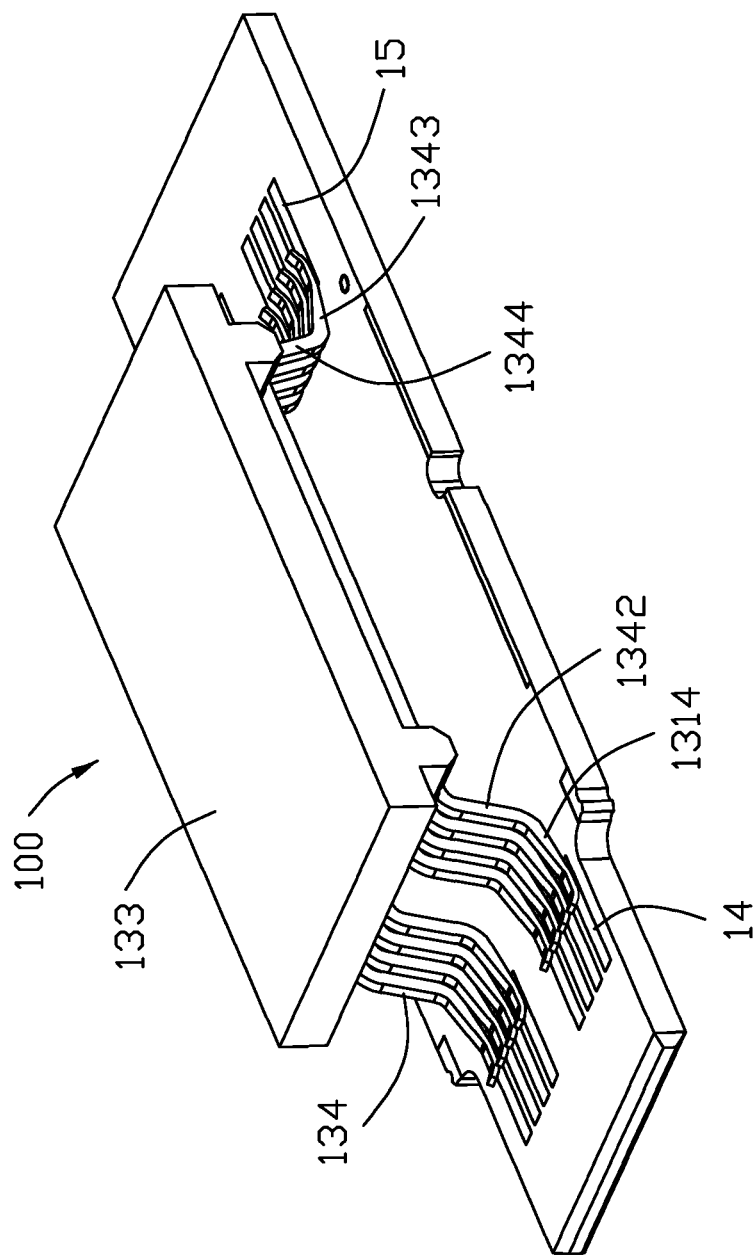
FIG. 4 is a partly perspective view of a second embodiment of a printed circuit board assembly in accordance with present invention.
Figure 5:
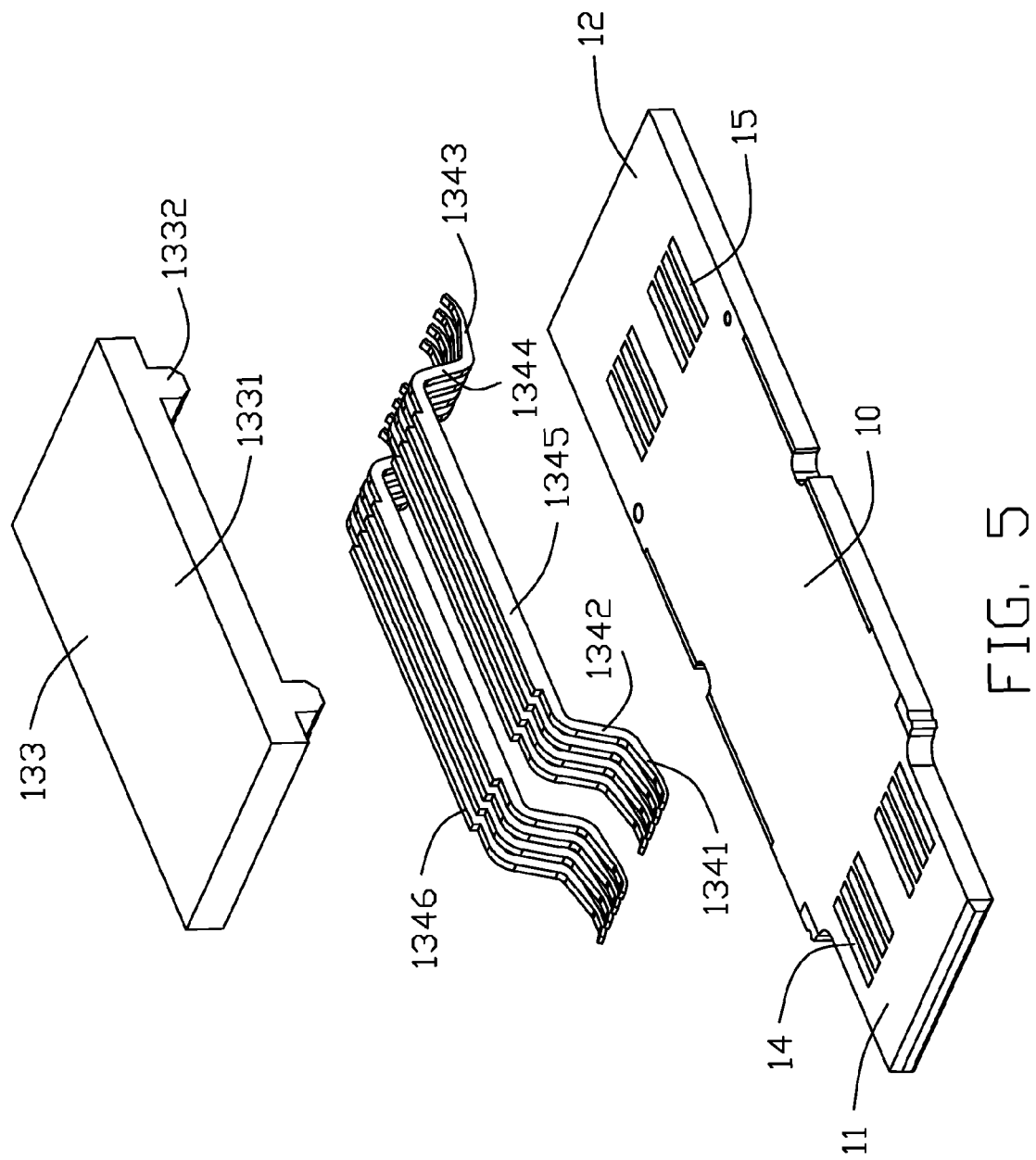
FIG. 5 is partly exploded view of the printed circuit board assembly as shown in FIG. 5.
Figure 6:
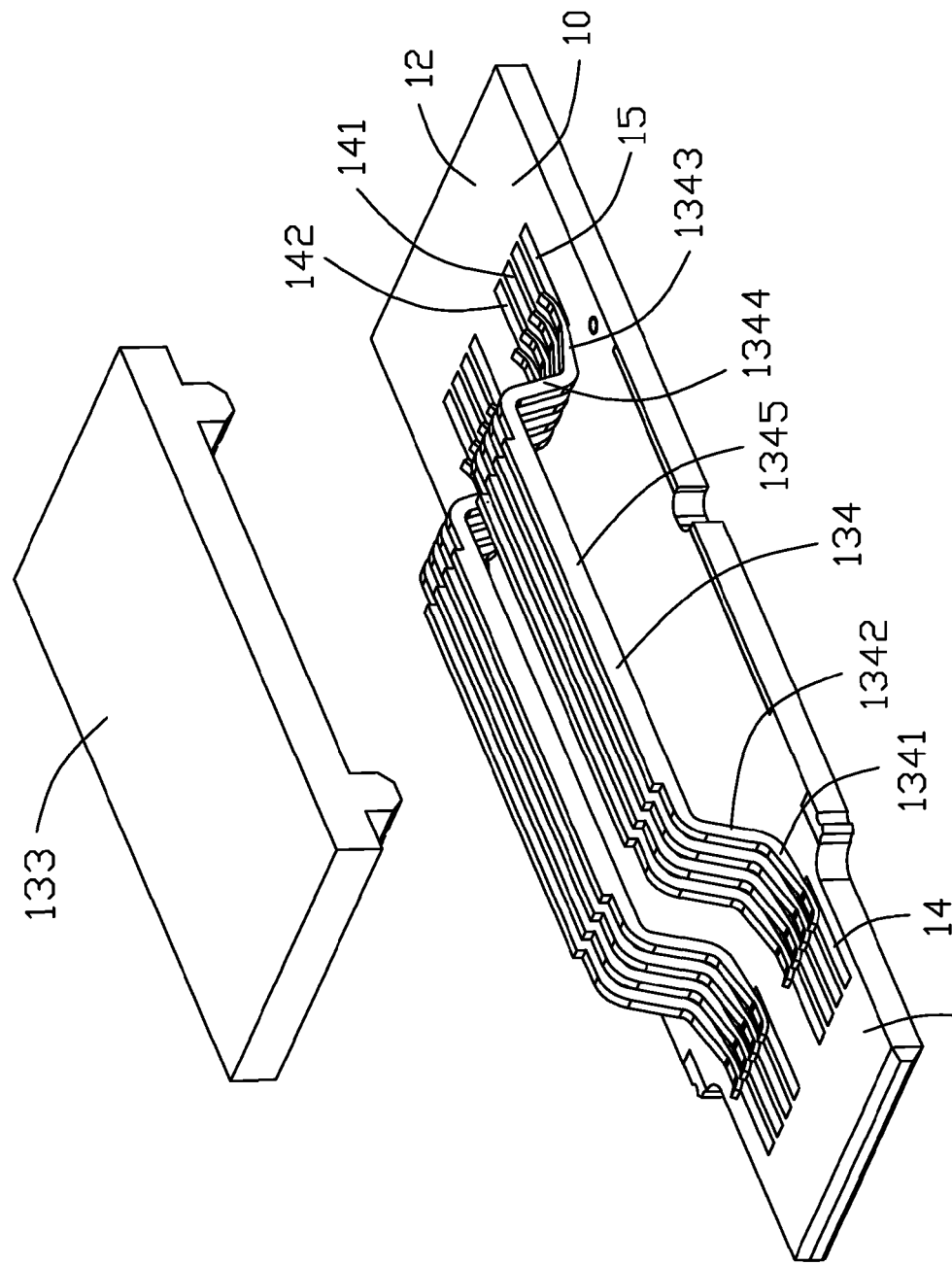
FIG. 6 is another partly exploded view of the printed circuit board assembly as shown in FIG. 5.

Referring to FIGS. 4 to 6, in a second embodiment according to the present invention of the printed circuit board assembly 100, the high speed line module 13 includes an insulative housing 133 and two groups of conductive lines 134 mounted on a bottom side of the insulative housing 133. The groups of the conductive lines 134 are similar to the groups of conductive lines 132, including four striped elastic conductive lines 134 extending in a vertical plane, which are spaced and parallel to each other. Similar to the conductive lines 132, the four conductive lines 134 include a pair of (outer) grounding lines and a pair of (inner) signal lines.

Each of the conductive lines 134 defines a first contacting portion 1341 rearwardly extending along the front-to-back direction, a third transition portion 1342 obliquely and upwardly extending from a rear end of the first contacting portion 1341, a second contacting portion 1343 forwardly extending along the front-to-back direction, a fourth transition portion 1344 obliquely and upwardly extending from a front end of the second contacting portion 1343 and symmetrical with the third transition portion 1342, and a middle holding portion 1345 connecting between the top ends of the third and fourth transition portions 1342, 1344. The middle holding portion 1345 extends in a horizontal plane higher than the plane of the printed circuit board 10. Each of the middle holding portions 1345 having an insertion portion 1346 upwardly extending along a bottom-to-top direction.

The insulative housing 133 includes a rectangular block-shaped main body 1331 and two opposite positioning portions 1332 downwardly extending from two opposite ends of the main body 1331 respectively. The positioning portions 1332 are of strip-shaped, the width of which is longer than the width of the groups of the conductive lines 134. The distance between the inside walls of the positioning portions 1332 is adapted to the length of the insertion portion 1346.

In the present embodiment, the insulative housing 133 can be made in slices with the plastic over-molded over the conductive lines 134 and than stacked together. A portion of the main body 1331 between the two positioning portions 1332 receives and fixes the insertion portions 1346 therein by over-molding of the insulative housing 133. In this embodiment, the insulative housing 133 is integrated with the printed circuit board assembly 100, and the relative position of the conductive lines 134 is remained by the insulative housing 133. The conductive lines 134 are made into spring fingers. When assembling of the printed circuit board assembly 100, the first and second contacting portion 1341, 1343 of the conductive lines 134 are aligned and contacted with the corresponding first and second pads 14, 15, and it is possible to maintain electrical contact without welding the first and second contacting portion 1341, 1343 on the printed circuit board 10, by the fixation of the insulative housing 133 and structure other than the printed circuit board assembly 100. The reducing of the soldering process effectively reduces the cost, although the insulative housing 133 may be more expensive than the lead frame 131. As another advantage, the insulative housing approach may be able to be integrated into a transceiver module housing (not shown) which encloses the printed circuit board assembly 100, and may reduce the process cost as the conductive lines 132 can be made into spring fingers that would not need to be soldered to the printed circuit board 10.

In another embodiment, the insulative housing 133 can be molded firstly, the portion of the main body 1331 between the two positioning portions 1332 defines two groups of receiving slots 1333 extending along the front-to-back direction, into which the insertion portions 1346 are plugged and fixed, to hold the conductive lines 134 relative to one another and orient them relative to the printed circuit board 10. When assembling of the printed circuit board assembly 100, the insertion portions 1346 of the conductive lines 134 are inserted into the corresponding receiving slots 1333, and the first and second contacting portion 1341, 1343 of the conductive lines 134 are aligned and contacted with the corresponding first and second pads 14, 15 of the printed circuit board 10, and the insulative housing 133 may be able to be removed from the conductive lines 134, after welding the first and second contacting portion 1341, 1343 on the corresponding first and second pads 14, 15. In this embodiment, the removing of the insulative housing 133 reduces the overall height of the printed circuit board assembly 100.

Relative to the existing prior art, the printed circuit board assembly 100 according to the present invention, the high speed line module 13 having two group of conductive lines 132, 134 disposed on the top side of the printed circuit board 10, and the conductive lines 132, 134 are individual wires sit above the printed circuit board 10, whose two opposite ends are soldered on the corresponding first and second pads 13, 14 to enabling conduction of the first pads 131 to the corresponding second pads 14. The conductive lines 132, 134 reduces cost by using higher dielectric loss (and less expensive) material. The conductive lines 132, 134 are sit above the printed circuit board 10, that reduce printed circuit board 10 process cost by utilizing the area underneath the conductive lines 132, 134 on the top layer, reducing complexity, reducing the number of layers, and enabling a signal-side SMT process. The signal integrity of the conductive lines 132, 134 is improved, as air is a better dielectric than any printed circuit board material. The surface area of the first and second pads 13, 14 together with the conducting pads of the edge connector are higher for given impedance implemented with air dielectric (reducing pads losses as well as dielectric losses). The printed circuit board 10 is allowed for more space thereon to be allocated for new ICs/components (as shown in the broken lines in FIG. 2) for future technologies (such as multi-level coding).

In brief, as shown in FIG. 2, the feature of the invention is to provide two rows of conductive pads opposite to and spaced from each other in the longitudinal direction Y while each row extends in the traverse direction X perpendicular to the longitudinal direction wherein each row of conductive pads include at least a pair of outer grounding pads sandwiching a pair of inner signal pads therebetween in the transverse direction. A group of conductive lines located between the two row of conductive pads in the longitudinal direction Y and having opposite (connecting) ends, i.e., the first connecting portions 1321 and the second connecting portions 1323 respectively mechanically and electrically connected to the two rows of conductive pads, include a pair of outer grounding lines and a pair of inner signal lines therebewteen in the transverse direction X corresponding to the pair of outer grounding pads and the pair of inner signal pads, wherein the middle connecting portions 1325 of such conductive lines are raised upwardly in the vertical direction Z perpendicular to both the longitudinal direction Y and the transverse direction X to extend in air to not only efficiently control the desired impedance through air but also leave a space above the printed circuit board and below the raised conductive lines for additional electronic components mounting on the printed circuit board, advantageously. Notably, to implement this lifting-up arrangement, it is required/preferred to provide two additional outer grounding lines by two sides of the inner signal lines as the escort, compared with the traditional conductive lines extending upon the surface of the printed circuit board without any space therebetween in the vertical direction.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, in some special arrangement the two rows of conductive pads may be arranged offset from each other in the transverse direction and the middle connecting portions of the conductive lines may correspondingly extend in a direction oblique to both the longitudinal direction and the transverse direction in a top view, thus resulting in the vector component along the longitudinal direction for each conductive line which is deemed still compliant with the claimed definition regarding extension along the longitudinal direction of the conductive line understandably.

What is claimed is:

1. A printed circuit board assembly comprising:
a printed circuit board (PCB) defining a mounting end and an opposite contacting end, a row of first pads on the mounting end, a row of second pads on the contacting end, and an edge connector on the contacting end electrically contacted with the second pads; and
a high speed line module mounted on an exterior surface of a top side of the PCB and including a group of conductive lines, the conductive lines extending parallel to each other and mostly distantly over said exterior surface of said top side of the PCB, each conductive line having two ends electrically connected to corresponding first and second pads, respectively.

2. The printed circuit board assembly as recited in claim 1, wherein both of the first pads and the second pads are provided with a pair of differential signal pads and a pair of grounding pads, and the pair of differential signal pads is disposed between the two grounding pads.

3. The printed circuit board assembly as recited in claim 2, wherein each of the conductive lines comprises:
a first contacting portion rearwardly extending along a front-to-back direction to electrically connect with a corresponding first pad;
a second contacting portion forwardly extending along the front-to-back direction to electrically connect with a corresponding second pad; and
a middle connecting portion connected between the first and second contacting portions, the middle connecting portion being spaced from the exterior surface of the top side of the PCB.

4. The printed circuit board assembly as recited in claim 3, wherein each of the conductive lines comprises a first transition portion upwardly extending from a rear end of the first contacting portion, a second transition portion upwardly extending from a front end of the second contacting portion, and the middle connecting portion connects between top ends of the first and second transition portions and extends in a line along the front-to-back direction.

5. The printed circuit board as recited in claim 4, wherein the high speed line module originally includes a removable lead frame of a rectangular ring, and there are two groups of conductive lines both of which are connected between the two opposite sides of the lead frame.

6. The printed circuit board assembly as recited in claim 5, wherein the first contacting portions of the conductive lines are extended from one side of the lead frame, and the second contacting portions of the conductive lines are extended from another side of the lead frame.

7. The printed circuit board assembly as recited in claim 6, wherein the lead frame includes two opposite first end sides extending along a horizontal direction perpendicular to the front-back-direction, and two opposite second sides extending along the front-to-back direction, the first and second contacting portions are extended from the first end sides respectively.

8. The printed circuit board assembly as recited in claim 7, wherein each of the second side defines a curved first holding portion rearwardly and downwardly extending from one first end side, a curved second holding portion forwardly and downwardly extending from another first end side and an arched portion upwardly extending and connected between the first and second holding portion, and the first holding portions of the two second sides are fixed on the two opposite sides of the PCB, and the second holding portions of the two second sides are fixed on two opposite sides of the PCB.

9. The printed circuit board assembly as recited in claim 8, wherein each of the first and second connecting portions of the conductive lines are previously formed with a broken mark, for facilitating the breaking operation thereof, thereby facilitating removing of the lead frame.

10. The printed circuit board assembly as recited in claim 4, the high speed line module includes an insulative housing assembled on the middle connecting portions of the conductive lines, and the insulative housing is made in slices with the plastic over-molded over the conductive lines and than stacked together.

11. The printed circuit board assembly as recited in claim 10, wherein each of the middle holding portions has an insertion portion upwardly extending along a bottom-to-top direction, and the insertion portions of the conductive lines are interference plugged into the insulative housing to be fixed in the insulative housing.

12. The printed circuit board assembly as recited in claim 11, wherein the insulative housing includes a main body and two opposite positioning portions downwardly extending from two opposite ends of the main body respectively, and the distance between the inside walls of the positioning portions is adapted to the length of the insertion portion.

13. The printed circuit board assembly as recited in claim 12, wherein the positioning portions are of strip-shaped, the width of which is longer than the width of the groups of the conductive lines.

14. The printed circuit board assembly as recited in claim 10, wherein each of the middle holding portions has an insertion portion upwardly extending along a bottom-to-top direction, and the insertion portions of the conductive lines are molded in the insulative housing to be fixed in the insulative housing.

15. The printed circuit board assembly as recited in claim 1, wherein said high speed line module is exposed in air.

\* \* \* \* \*